United States Patent [19]

Fromson et al.

[11] Patent Number: 4,731,317

[45] Date of Patent: Mar. 15, 1988

[54] LASER IMAGABLE LITHOGRAPHIC PRINTING PLATE WITH DIAZO RESIN

[75] Inventors: Howard A. Fromson, 15 Rogues Ridge Rd., Weston, Conn. 06880; Robert F. Gracia, Weston, Conn.

[73] Assignee: Howard A. Fromson, Rockville, Conn.

[21] Appl. No.: 939,263

[22] Filed: Dec. 8, 1986

Related U.S. Application Data

[63] Continuation of Ser. No. 618,586, Jun. 8, 1984, abandoned.

[51] Int. Cl.$^4$ .............. G03C 1/94; G03C 1/52; G03C 1/54; G03C 1/60

[52] U.S. Cl. .................. 430/159; 430/155; 430/157; 430/158; 430/175; 430/276; 430/271; 430/272; 430/278; 430/945

[58] Field of Search .......... 430/155, 157, 175, 276, 430/278, 271, 945, 159, 158, 272

[56] References Cited

U.S. PATENT DOCUMENTS

| | | | |
|---|---|---|---|
| 3,181,461 | 5/1965 | Fromson | 430/278 |
| 3,284,197 | 11/1966 | Smith et al. | 430/302 |
| 3,619,157 | 11/1971 | Brinckman | 430/290 |
| 3,964,389 | 6/1976 | Peterson | 430/945 |
| 4,004,924 | 1/1977 | Vrancken et al. | 430/290 |
| 4,020,762 | 5/1977 | Peterson | 430/945 |
| 4,063,949 | 12/1977 | Uhlig et al. | 430/945 |
| 4,183,788 | 1/1980 | Fromson et al. | 430/278 |
| 4,230,770 | 10/1980 | Roennau et al. | 430/276 |
| 4,248,959 | 2/1981 | Jeffers et al. | 430/945 |
| 4,277,555 | 7/1981 | Fromson et al. | 430/278 |
| 4,426,437 | 1/1984 | Fisch et al. | 430/166 |
| 4,427,500 | 6/1984 | Platzer | 430/278 |
| 4,501,810 | 2/1985 | Fromson et al. | 430/278 |
| 4,554,057 | 11/1985 | Mohr | 430/278 |
| 4,555,475 | 11/1985 | Gomson et al. | 430/278 |

OTHER PUBLICATIONS

Research Disclosure, #18833, 12/1979, p. 671.

*Primary Examiner*—Charles L. Bowers, Jr.
*Attorney, Agent, or Firm*—Felfe & Lynch

[57] ABSTRACT

A coated lithographic printing plate comprises a grained, anodized aluminum substrate and coating thereon comprising a diazo resin in admixture with particulate energy absorbing material that will absorb incident radiation and re-radiate it as radiation that will change the diazo resin coating which is imageable with a Crosfield Datrax 760 YAG laser plate maker producing incident radiation of 1/06 microns. The topography of the substrate and the particulate material in the coating trap and convert a substantial portion of the incident laser radiation which passes through the coating without substantially affecting same into radiation that will change the coating.

5 Claims, No Drawings

LASER IMAGABLE LITHOGRAPHIC PRINTING PLATE WITH DIAZO RESIN

This application is a continuation, of application Ser. No. 618,586, filed Jun. 8, 1984, abandoned.

This invention relates to planar light traps whereby incident radiation is converted into or reemerges as energy that will bring about a change in a coating on the planar trap. More particularly, this invention relates to laser imagable lithographic printing plates, wherein non laser radiation is converted into radiation that will directly form an ink-loving image in a light sensitive coating that is normally substantially unaffected by laser radiation.

BACKGROUND

In the art of lithographic printing plates, there are many options for producing an image useful for printing. These include an additive, one-step resin reinforced image; a subtractive photo-polymer image; a subtractive diazo-resin reinforced image; a subtractive photo-polymer on diazo image; an additive one-step reinforced image post-cured with heat, a subtractive diazo image; photo-polymer image reinforced and post-exposed, bi-metal and tri-metal plates and resin particles in a diazo matrix. The image is conventionally formed by exposing a plate coated with a light sensitive material to UV light through a full size film negative or positive.

The lithographic printing industry has been searching for a dependable laser imagable lithographic printing plate for more than ten years. In the newspaper industry the laser imagable plate would enable the newspaper to assemble its copy in a metropolitan center and to have it printed in a plant far removed from the center. In some instances, this would be done in a satellite printing plant situated only a few miles from the editorial offices, and in other instances, the printing plants would be located many thousands of miles away. Additionally, other printing establishments, among them small newspapers, have been interested in a laser imagable plate which would permit them to eliminate their silver halide negatives.

There exist three modes of direct laser imagable plates today: electrostatic, ultraviolet, and infrared.

The electrostatic plates involve the electrostatic toning of a lithographic substrate either directly or by transfer from an intermediate.

The ultraviolet imagable plates are imaged by very powerful, generally Argon-Ion lasers which require large inputs of energy as well as water cooling. Typical units are manufactured by EOCOM, a division of American Hoechst and are powered in some cases by lasers delivering as much as 18 watts of output energy. Since the Argon-Ion generates only about 15% of its energy in the UV wave lengths, it requires a very powerful laser. Efficiency in the 4–5 watt total spectrum range has been claimed, but present information indicates that there is no commercial unit performing at this energy level.

The infrared YAG laser manufactured by LogE, a division of Crosfield Data Systems, Inc. generates its energy at 10,600 Angstroms, i.e., one micron. It has been used in the past by placing a graphite impregnated mask over a bare lithographic plate and blasting the graphite and its resin binder onto the plate where it is subsequently fused and lacquered. The plate requires a graphite coated Mylar or PVC film mask (e.g. U.S. Pat. No. 3,964,389) and delivers a product which is variable in quality and expensive because of the need for both a plate and a coating mask.

SUMMARY

In its broadest aspects this invention provides a coated planar light trap comprising a grained and anodized aluminum sheet (which preferably is also anionic and negatively charged by treatment with sodium silicate for example) and an organic coating which can be a photosensitive material such as a diazo resin or a non-film forming emulsion polymer, either of which may contain or include energy absdorbing particulate material such as carbon black.

The topography of the grained and anodized sheet traps and converts a substantial portion of incident-radiation, for example, laser radiation, which passes through the organic coating without substantially affecting same into radiation that will change the organic coating upon emerging from the light trap. In the case of a photosensitive material, the converted radiation alters the solubility of the material and renders it ink loving. In the case of an emulsion polymer coating, the emulsion coating is changed into a substantially continuous film by virtue of the fact that the re-emergent radiation exceeds the glass transition temperature of the polymer.

It is believed that the incident radiation passes through the organic coating without changing the coating and is simultaneously absorbed by the anodic oxide coating and reflected by the underlying aluminum metal. What results is re-emergent, longer wave radiation now in a form which will not pass through the organic coating without changing it. Particulate energy absorbing material such as carbon black also absorbs incident radiation and re-radiates it at a longer wave length which will change the organic coating.

The present invention provides a grained and anodized, hydrophilic aluminum substrate having a grain configuration capable of internally trapping and reflecting laser radiation to increase its wave length and a photosensitive coating (such as a diazo resin) which becomes insoluble and ink loving upon exposure to actinic radiation such as UV light or heat but which is normally unaffected by (transparent to) conventional laser radiation, e.g. 10,600 Angstroms which is the output of a YAG laser. The grained substrate (and particulate energy absorbing material when present) converts the laser energy (which would otherwise pass through the coating) to longer wave actinic energy, such as infrared energy of 46,500 Angstroms or more, which causes the laser struck areas to become insoluble and ink loving.

A lacquer containing a cationic material can also be used to cover or patch holes in the laser struck image areas of the photosensitive coating if the laser ablates or removes portions of the image exposing the underlying substrate.

DESCRIPTION

The present invention provides a laser imagable lithographic printing plate utilizing a technique for imaging a photosensitive coating with an energy source such as a YAG laser at 10,600 Angstroms, to which the coating is normally transparent. This is achieved, for example, by laying down on a grained and anodized, hydrophilic aluminum surface, having a grain configuration capable of internally trapping laser radiation, a coating of diazo resin or a non-film forming emulsion, each preferably with particulate energy absorbing material such as carbon black.

It is possible to image diazo with a YAG laser where the grain is relatively deep relative to its width so as to internally trap the output of the YAG laser. Such lithographic substrates are characterized by high light absorption and the laser radiation bounces back and forth laterally within the valley of the grain as it is absorbed and remitted at progressively longer wave lengths.

Diazo resins, although unaffected by light at wave lengths between 8,000 Angstroms and 10,600 Angstroms, have a very pronounced reaction to radiant energy in the infrared at 46,500 Angstroms or more. It is believed that in the process of imaging, the YAG laser energy is degraded and its wave length becomes progressively longer as it is absorbed and re-radiated from the sidewalls of the grain. It is believed that the diazo nitrogen-to-nitrogen bond is broken at the 46,500 Angstroms wave length. In other words, the effective wave length of the YAG laser is shifted from 10,600 Angstroms to 46,500 Angstroms and higher by creating an optical light trap mechanism using the sidewalls of the grain so the diazo resin sees the energy at its infrared sensitive peak of 46,500 Angstroms.

The present invention provides a laser imagable, lithographic printing plate comprising a grained and anodized, hydrophilic (anionic and negatively charged) aluminum substrate coated with a photosensitive material which has its solubility characteristics altered when struck by actinic radiation but which is transparent to laser radiation. The grain configuration of the substrate (or the combination of the grain and carbon black) is capable of trapping, absorbing and reradiating the laser radiation to convert it into actinic energy which will alter the solubility of the photosensitive material.

The substrate is grained and anodized aluminum which is preferably silicated to render it hydrophilic. Preferably the photosensitive material is a diazo resin.

Where the level of laser radiation is relatively high, ablation or removal of diazo in the imaged areas can be experienced. If this occurs, a lacquer or the like containing a cationic material can be used to cover or patch the ablation areas.

Most hydrophilic, lithographic substrates are known to have a negative charge. Removal of imaged diazo via ablation with a laser can create undesirable voids or holes exposing the negatively charged substrate in the imaged areas. This leads to voids in the imaged areas. These imaged voids can be illuminated by using cationic lacquers as detailed herein.

A grained, anodized surface creates hills and valleys which are believed to absorb and re-radiate laser radiation at higher wave lengths to which the coatings are sensitive. U.S. Pat. No. 4,183,788 issued Jan. 15, 1980, sets forth a preferred process for graining aluminum for use as a lithographic substrate in the invention.

One measure of a suitably grained and anodized substrate for use in the invention is absorption of energy at various wave lengths. The following table illustrates this:

TABLE I

| No. | Substrate | Percent Absorption of Energy | | | |
|---|---|---|---|---|---|
| | | 3500 Å | 6000 Å | 8250 Å | 10,600 Å |
| 1. | S. D. Warren-grained and anodized | 3 | 14 | 27 | 12 |

TABLE I-continued

| No. | Substrate | Percent Absorption of Energy | | | |
|---|---|---|---|---|---|
| | | 3500 Å | 6000 Å | 8250 Å | 10,600 Å |
| 2. | Omega-Ano-Coil grained and anodized | 33 | 45 | 52 | 39 |
| 3. | Advance Offset grained and anodized | 41 | 38 | 50 | 33 |
| 4. | No grain-anodized | 16 | 32 | 50 | 39 |
| 5. | No grain-anodized | 2 | 20 | 48 | 23 |
| 6. | Grained and anodized | 59 | 65 | 75 | 63 |
| 7. | Delta-Ano-Coil grained and anodized | 60 | 63 | 73 | 65 |
| 8. | Grained and anodized | 61 | 67 | 75 | 64 |
| 9. | Grained and anodized. | 86 | 80 | 76 | 79 |

Absorption measurements were taken with a Perkin Elmer Model 330 Spectrophotometer with an integrating sphere for measuring light from diffused surfaces.

A further measure of a suitably grained and anodized substrate is anodic coating weight and thickness. For example, the substrates set forth in Table I above have the following anodic coating weights and thicknesses:

TABLE II

| Substrate No. | Coating Thickness Microns | Coating Weight, Milligrams per in.$^2$ |
|---|---|---|
| 1. | 0.7 | 0.9–1.0 |
| 2. | 0.5 | 0.9–1.1 |
| 7. | 0.85 | 1.2–1.25 |
| 8. | 1.30 | 1.8 |
| 9. | 1.30 | 2.0 |
| 10. (Alpha-Ano-Coil) | 0.43 | 0.6–0.8 |
| 11. (PSQ-Ano-Coil) | 1.10 | 1.6–1.8 |

Suitable substrates can be characterized as having an anodic coating thickness equal at least to the wave length of the incident radiation and absorption of at least 50% and preferably more than 55 to 60% of the incident radiation. This is demonstrated by the fact that Substrates 1–5, 7 and 10 did not consistently result in an acceptable printing plate following the procedures of Examples 1 or 2 herein whereas substrates 6, 8, 9 and 11 consistently produced acceptable lithograph printing plates following Examples 1 and 2 herein.

It has also been discovered that non-film forming polymer emulsions such as LYTRON 614, which is a styrene based polymer with a particle size on the order of 1000 Angstroms, can be used, alone or with an energy absorbing material such as carbon black, to form an image according to the invention. In this embodiment, the polymer emulsion coating is not light sensitive but the substrate used herein converts laser radiation to a level of radiation that will fuse the polymer particles in the image area. In other words, the glass transition temperature (Tg) of the polymer is exceeded in the imaged areas thereby fusing the image in place onto the substrate. The background can be removed using a suitable developer to remove the non-laser struck portions of the non-film form coating. Since the fused polymer is ink loving, an excellent laser imaged plate results without using a light sensitive coating such as diazo.

The present invention provides a process for making a planar lithographic light trap which comprises:

(a) coating the surface of a grained and anodized aluminum substrate with an organic coating, and (b) exposing the coated substrate to incident radiation which passes through the organic coating without substantially affecting same but which is trapped and converted by the topography of the grained and anodized substrate into radiation which alters the organic coating.

The process for making a lithographic printing plate comprises:

(a) coating the surface of a grained and anodized hydrophilic aluminum substrate having a grain configuration or topography capable of internally trapping, absorbing and reradiating laser radiation with a photosensitive material capable of altering its solubility characteristics when struck by actinic radiation but unaffected by laser radiation, (b) selectively exposing the coated substrate to an image-forming laser and converting said laser radiation to actinic energy which will change the solubility of said photosensitive material to form an insoluble image; and (c) developing the image by applying a developer, preferably one containing a cationic material if laser exposure removes portions of the image.

Diazo resins are insolubilized by actinic radiation such as UV light (3200-4000 Angstroms wave length) or IR radiation beginning at about 46,500 Angstroms in the infrared. At energy sources of 10,600 Angstroms, diazo resins are unaffected. Since conventional YAG lasers function at 10,600 Angstroms they are unsuited for directly imaging diazo sensitized plates. The present invention overcomes this drawback.

The substrate for use in the lithographic printing plate according to the invention is grained and anodized aluminum which can be silicated to render it hydrophilic (U.S. Pat. No. 3,181,461, Fromson). A preferred material is brush grained, anodized and silicated aluminum (see U.S. Pat. No. 4,183,788).

The photosensitive material is preferably a diazo resin having reactive sites which are capable of being chemically altered by actinic radiation to adhere to diazo resin to the hydrophilic substrate in the laser struck areas. Suitable diazo compounds are described, inter alia, in U.S. Pat. Nos. 2,063,631, 2,677,415, 2,679,498, 3,050,502, 3,311,605, 3,163,633, 3,406,159 and 3,277,074.

A suitable diazo resin for the present invention is the condensation product of 3-methoxy-4-diazo-diphenylamine and paraformaldehyde. Another suitable diazo resin is one commercially available from Fairmount Chemical Company designated Diazo Resin No. 4.

To produce an imaged lithographic printing plate, a plate produced by coating a hydrophilic grained substrate with a photosensitive material such as diazo resin is first exposed via a laser, preferably a LogEscan YAG laser plate maker which operates at 10,600 Angstroms.

The exposed plate is then developed. Where the diazo is insolubilized only in the image area, any suitable developer or lacquer-developer may be used. However, because the power output of a YAG laser can vary, it is possible that portions of the image will be removed during laser exposure to reveal portions of the hydrophilic substrate. By using a cationic lacquer developer such as Black Diamond by Western Litho or Graphic T by Samson these voids in the imaged areas are replaced by adherent resins. Alternatively, cationic surfactants such as aqueous quaternary ammonium salts can be applied first, followed by the application of a resin lacquer. The use of a cationic surfactant or lacquer-developer produces an image, portions of which are comprised of resin bonded to destroyed diazo and others comprised of resins bonded to negatively charged substrate via the positively charged cationic surfactants.

An aqueous, anionic developer can be used to develop a plate if laser exposure converts diazo only to its insoluble state without removing portions of the image. If image removal occurs, a cationic lacquer-developer is used first and an anionic finisher can be used to remove any residual diazo that remains in the background of the plate (cf. U.S. Pat. Nos. 4,391,897 and 4,414,315).

The following examples illustrated the invention and the manner in which it may be performed without limiting same in any manner:

EXAMPLE 1

A coil of aluminum (Alloy 1100-Alcoa) was brush grained in web form using an aqueous abrasive slurry containing alumina (A2-Alcoa) according to U.S. Pat. No. 4,183,788. After graining, the web was treated in a heated bath at 100° F. of dilute sodium hydroxide, rinsed, dipped in an aqueous solution of 50% nitric acid, rinsed, anodized for 32 ampere-minutes to achieve an anodic coat weight of 1.4–1.6 milligrams alumina/in$^2$, rinsed, dipped in a bath of sodium silicate (3%), rinsed, and dried.

Single page newspaper size plates were cut from the coil described above. These plates are coated with a diazo prepared by the condensation of 3-methoxy-4-diazo diphenylamine and paraformaldehyde.

The plates were coated with a three roll sheet coater, face up. A thin coating was applied.

The coated plates were placed in a Crosfield Data Systems' Datrax 760 Laser plate maker and exposed with a write laser. After exposure, the plate was lacquered with an additive black non-ionic lacquer made by Fairmount Chemical Company. The imaged plate accepted lacquer and ink readily.

EXAMPLE 2

A newspaper size plate was brush grained, anodized, and silicated as in Example 1. The plate was coated with a light sensitive coating having Water-500 cc Diazo (Fairmount Chemical Co. Diazo Resin) 42.0 grams Aquablak 115 (carbon black, Borden Chemical Co.) 84.50 grams.

The plates were coated on a Talboys coater—1 pass. The coated plate was placed in a Datrax 760 YAG plate maker and scanned for approximately 2 minutes at a scanning rate of 1000 lines per minute. The thus exposed plate was then placed in a Tasope automatic lacquering processor containing Fairmount lacquer. The plate from the processor has a strong black image. This plate was placed on a Goss metro Press and 25,000 good copies were made with no apparent wear.

EXAMPLE 3

A newspaper size plate was brush grained, anodized, and silicated as in Example 1. The plate was coated and exposed to a laser as in Example 2. The exposed plate is immersed in a 5% solution of sodium lauryl sulfate, rinsed and dryed. This plate will accept ink readily without further lacquering.

EXAMPLE 4

A coil of aluminum (Alloy 1100) was brush grained, in web form, using an aqueous abrasive slurry containing alumina (T61, 325 mesh, Alcoa) according to U.S. Pat. No. 4,183,788. After graining, the web was treated by immersion in dilute caustic at 80° F. Next, the web was rinsed, treated with nitric, rinsed, anodized at 38 ampere-minutes in sulfuric acid, rinsed, silicated (3%), rinsed, and dryed. This brush grained, anodized, silicated substrate is similar to substrate No. 9 in Table I above.

Newspaper size plates are cut from this coil and coated with the following coating composition:
  1800 cc Diazo (prepared in Example 1)
  180 ml Aquablak G (Borden Chemical Co.)
  4.5 gr Malachite Green
  360 ml Isopropyl alcohol.

The plates were coated on a three roll coater face up (Union Tool Company)—1 pass. After coating, three (3) plates were exposed on a Datrax 760 Laser plate maker. These plates were then lacquered to produce a strong, black, adherent image. The plates were placed on a Goss Metro Press and printed more than 50,000 good copies with no wear.

EXAMPLE 5

A newspaper size plate was brush grained, anodized and silicated, coated and exposed as in Example 1. This plate was then lacquered with Western Litho's Black Diamond lacquer containing a cationic material. A very intense adherent, abrasive resistant, black image resulted from this treatment.

EXAMPLE 6

A newspaper size plate was brush grained, anodized, silicated, coated, and exposed as in Example 4. This plate was lacquered with Samson developer containing a cationic material made by Graphic Arts Technical and Consulting Services. As in Example 5, a very intense, adherent, abrasive resistant image appeared.

CONTROL

A newspaper size plate was brush grained as in Example 1. After graining, the plate was treated in caustic at a higher temperature (120° F.) than in Example 1. The plate was then rinsed, immersed in dilute nitric, rinsed, anodized in sulfuric acid for 18 ampere-minutes, rinsed, silicated, rinsed, and dryed. This substrate is similar to substrate No. 2 in Table I above. The plate was sensitized as in Example 4 and exposed in a Datrax 760 Laser plate maker. Four (4) plates were exposed at 6, 7, 8 and 9 watts. These plates were lacquered with Fairmount lacquer. Non-Acceptable image quality results on all plates, 9 watts being better than 6 watts. When the same plates were lacquered with Western Black Diamond developer, better images at all power levels resulted, but they were still not functional as printing plates.

What is claimed:

1. Coated planar lithographic printing plate comprising a grained, anodized aluminum substrate and coating thereon comprising a diazo resin in admixture with particulate energy absorbing material that will absorb incident radiation and re-radiate it as radiation that will change said diazo resin coating which is imageable with a Crosfield Datrax 760 YAG laser plate maker producing incident laser radiation at 1.06 microns, said grined and anodized substrate having an anodic coating thickness equal to at least the wavelength of said incident laser radiation but not greater than 1.30 microns and being capable of absorbing at least 50% of the laser radiation used for imaging, the topography of said substrate and said particulate material in said coating trapping and converting a substantial portion of said incident laser radiation which passes through said coating without substantially affecting same into radiation that will change said coating.

2. Lithographic printing plate of claim 1 wherein said grained and anodized aluminum sheet is anionic and negatively charged.

3. Lithographic printing plate of claim 1 developed with a developer containing a cationic material.

4. Printing plate of claim 1 wherein the substrate is silicated to render it hydrophilic.

5. Printing plate of claim 1 wherein the particulate material is carbon black or graphite.

* * * * *

UNITED STATES PATENT AND TRADEMARK OFFICE
CERTIFICATE OF CORRECTION

PATENT NO. : 4,731,317

DATED : March 15, 1988

INVENTOR(S) : Howard A. Fromson, et al.

It is certified that error appears in the above-identified patent and that said Letters Patent is hereby corrected as shown below:

Column 8, line 26 for "grined" read -- grained --.

In the Abstract, line 8 for "1/06" read -- 1.06 --.

Signed and Sealed this

Seventeenth Day of January, 1989

Attest:

DONALD J. QUIGG

Attesting Officer

Commissioner of Patents and Trademarks